(12) United States Patent
Shih

(10) Patent No.: US 11,189,563 B2
(45) Date of Patent: Nov. 30, 2021

(54) SEMICONDUCTOR STRUCTURE AND MANUFACTURING METHOD THEREOF

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 6 days.

(21) Appl. No.: 16/528,673

(22) Filed: Aug. 1, 2019

(65) Prior Publication Data

US 2021/0035905 A1    Feb. 4, 2021

(51) Int. Cl.

| H01L 21/768 | (2006.01) |
| H01F 17/06 | (2006.01) |
| H01F 17/00 | (2006.01) |
| H01F 27/28 | (2006.01) |
| H01L 23/522 | (2006.01) |
| H01L 23/48 | (2006.01) |
| H01L 25/065 | (2006.01) |
| H01L 25/00 | (2006.01) |
| H01L 23/00 | (2006.01) |

(52) U.S. Cl.
CPC ..... *H01L 23/5227* (2013.01); *H01F 17/0033* (2013.01); *H01F 17/06* (2013.01); *H01L 21/76831* (2013.01); *H01L 21/76843* (2013.01); *H01L 21/76898* (2013.01); *H01L 23/481* (2013.01); *H01L 24/32* (2013.01); *H01L 24/83* (2013.01); *H01L 25/0657* (2013.01); *H01L 25/50* (2013.01); *H01F 2017/0086* (2013.01); *H01F 2027/2809* (2013.01)

(58) Field of Classification Search
CPC ............... H01F 17/0033; H01F 17/06; H01F 2017/0086; H01F 2027/2809
See application file for complete search history.

(56) References Cited

U.S. PATENT DOCUMENTS

| 5,297,967 A * | 3/1994 | Baumberger | ........ H05K 7/1069 |
| | | | 439/66 |
| 5,852,866 A * | 12/1998 | Kuettner | ............... H01F 41/046 |
| | | | 29/608 |
| 6,023,251 A * | 2/2000 | Koo | ......................... H01Q 1/36 |
| | | | 343/700 MS |
| 6,388,551 B2 * | 5/2002 | Morikawa | ................. H01P 5/10 |
| | | | 29/602.1 |
| 6,821,872 B1 * | 11/2004 | Liao | .................. H01L 21/76829 |
| | | | 257/E21.507 |

(Continued)

*Primary Examiner* — Maliheh Malek
(74) *Attorney, Agent, or Firm* — CKC & Partners Co., LLC

(57) ABSTRACT

The semiconductor structure includes a first die, a second die, a connecting portion, and a through-substrate via. The first die includes a first dielectric layer and a first helical conductor embedded therein. The second die includes a second dielectric layer and a second helical conductor embedded therein, wherein the second dielectric layer is bonded with the first dielectric layer, thereby forming an interface. The connecting portion extends from the first dielectric layer through the interface to the second dielectric layer and interconnects the first helical conductor with the second helical conductor. The through-substrate via extends from the first die to the second die through the interface, wherein the through-substrate via is surrounded by the first and the second helical conductors.

9 Claims, 9 Drawing Sheets

(56) References Cited

U.S. PATENT DOCUMENTS

| | | | | |
|---|---|---|---|---|
| 7,046,113 B1* | 5/2006 | Okamoto | H01F 17/0006 | 336/200 |
| 7,852,186 B2* | 12/2010 | Fouquet | H01F 27/2804 | 336/200 |
| 8,169,050 B2* | 5/2012 | Daley | H01L 27/0688 | 257/531 |
| 8,338,929 B2* | 12/2012 | Chen | H01L 25/0657 | 257/686 |
| 8,400,248 B2* | 3/2013 | Kim | H01Q 7/00 | 336/200 |
| 9,035,195 B2* | 5/2015 | Huang | H05K 1/117 | 174/261 |
| 9,449,935 B1* | 9/2016 | Shih | H01L 23/145 | |
| 9,576,717 B2* | 2/2017 | Persson | H01F 41/041 | |
| 9,711,272 B2* | 7/2017 | Hassan-Ali | H02J 50/70 | |
| 9,935,071 B1* | 4/2018 | Lin | H01L 24/13 | |
| 9,966,363 B1* | 5/2018 | Lin | H01L 25/50 | |
| 10,121,739 B1* | 11/2018 | Kirby | H01L 25/0657 | |
| 10,475,877 B1* | 11/2019 | Hsu | H01F 27/24 | |
| 10,504,784 B2* | 12/2019 | Huang | H01L 21/76877 | |
| 2002/0118075 A1* | 8/2002 | Ohwada | H01Q 1/36 | 333/32 |
| 2003/0003603 A1* | 1/2003 | Chaudhry | H01L 23/5227 | 438/3 |
| 2003/0013264 A1* | 1/2003 | Yeo | H01L 23/5227 | 438/381 |
| 2004/0108967 A1* | 6/2004 | Fujimura | H01Q 5/357 | 343/895 |
| 2005/0057430 A1* | 3/2005 | Noguchi | H01Q 1/362 | 343/895 |
| 2008/0174395 A1* | 7/2008 | Lee | H01F 17/0006 | 336/69 |
| 2008/0204183 A1* | 8/2008 | Loza | H01F 17/0013 | 336/200 |
| 2008/0265238 A1* | 10/2008 | Chen | H01L 45/1666 | 257/3 |
| 2008/0265367 A1* | 10/2008 | Tan | H01L 24/81 | 257/531 |
| 2009/0140383 A1* | 6/2009 | Chang | H01L 23/5227 | 257/531 |
| 2009/0188104 A1* | 7/2009 | Ching | H01F 41/046 | 29/602.1 |
| 2011/0037679 A1* | 2/2011 | Shlager | H01Q 11/08 | 343/876 |
| 2011/0128026 A1* | 6/2011 | Skaling | G01N 27/00 | 324/755.04 |
| 2012/0187530 A1* | 7/2012 | Zhang | H01L 21/76898 | 257/531 |
| 2012/0256290 A1* | 10/2012 | Renna | H01L 23/48 | 257/506 |
| 2012/0268229 A1* | 10/2012 | Yen | H01L 23/5227 | 336/200 |
| 2012/0299798 A1* | 11/2012 | Leisten | H01Q 5/35 | 343/895 |
| 2013/0063234 A1* | 3/2013 | Kamath | H01F 27/2804 | 336/57 |
| 2013/0154785 A1* | 6/2013 | Yokoyama | H01F 41/041 | 336/200 |
| 2013/0168809 A1* | 7/2013 | Yen | H01L 28/10 | 257/531 |
| 2013/0307166 A1* | 11/2013 | Doebler | H01L 21/76838 | 257/786 |
| 2014/0203398 A1* | 7/2014 | Sturcken | H01F 17/0033 | 257/531 |
| 2014/0323046 A1* | 10/2014 | Asai | H01Q 1/2283 | 455/41.2 |
| 2015/0200163 A1* | 7/2015 | Lin | H01L 25/074 | 257/621 |
| 2016/0248397 A1* | 8/2016 | Ishizuka | H01F 27/29 | |
| 2016/0379935 A1* | 12/2016 | Shih | H01L 23/49827 | 257/738 |
| 2017/0011837 A1* | 1/2017 | Hassan-Ali | H01F 27/2804 | |
| 2017/0011838 A1* | 1/2017 | Asada | H01F 27/29 | |
| 2017/0263536 A1* | 9/2017 | Lin | H01L 21/76816 | |
| 2017/0339791 A1* | 11/2017 | Adachi | H01F 27/2895 | |
| 2017/0373003 A1* | 12/2017 | Lin | H01L 25/117 | |
| 2018/0090830 A1* | 3/2018 | McMichael | H01Q 1/241 | |
| 2018/0233479 A1* | 8/2018 | Lin | H01L 24/80 | |
| 2018/0315541 A1* | 11/2018 | Okura | H01F 27/292 | |
| 2018/0323133 A1* | 11/2018 | Kirby | H01L 25/0657 | |
| 2018/0323145 A1* | 11/2018 | Kirby | H01F 17/0033 | |
| 2018/0323369 A1* | 11/2018 | Kirby | H01F 17/0033 | |
| 2019/0066908 A1* | 2/2019 | Ueda | H01F 27/2804 | |
| 2019/0088402 A1* | 3/2019 | Kim | H01F 17/0013 | |
| 2019/0164676 A1* | 5/2019 | Tsuduki | H01F 17/0033 | |
| 2019/0172624 A1* | 6/2019 | Sturcken | H01F 13/003 | |
| 2020/0066830 A1* | 2/2020 | Bharath | H01L 23/645 | |
| 2020/0075220 A1* | 3/2020 | Wada | H01F 27/2804 | |
| 2020/0185307 A1* | 6/2020 | Tsai | H01L 25/0657 | |
| 2020/0203314 A1* | 6/2020 | Cook | H03B 5/08 | |
| 2020/0303361 A1* | 9/2020 | Shih | H01L 24/73 | |
| 2020/0350140 A1* | 11/2020 | Van Zyl | H03H 7/0138 | |
| 2021/0065975 A1* | 3/2021 | Ishima | H01F 41/12 | |
| 2021/0082818 A1* | 3/2021 | Kirby | H01L 23/5227 | |
| 2021/0118827 A1* | 4/2021 | Chen | H01L 23/645 | |

* cited by examiner

100

```
┌─────────────────────────────────────────────────┐
│ Receive a first die and a second die, wherein   │
│ the first die includes a first dielectric layer │
│ and a first helical conductor embedded therein, │──── 110
│ and the second die includes a second dielectric │
│ layer and a second helical conductor embedded   │
│ therein                                         │
└─────────────────────────────────────────────────┘
                         │
                         ▼
┌─────────────────────────────────────────────────┐
│ Bond the first dielectric layer and the second  │
│ dielectric layer so that the first helical      │──── 120
│ conductor is in contact with the second helical │
│ conductor                                       │
└─────────────────────────────────────────────────┘
                         │
                         ▼
┌─────────────────────────────────────────────────┐
│ Form a through-substrate via through the first  │
│ die and the second die, wherein the through-    │──── 130
│ substrate via is surrounded by the first and    │
│ the second helical conductors                   │
└─────────────────────────────────────────────────┘
```

Fig. 2

SEMICONDUCTOR STRUCTURE AND MANUFACTURING METHOD THEREOF

BACKGROUND

Field of Invention

The present disclosure relates to a semiconductor structure and a manufacturing method thereof. More particularly, the present disclosure relates to a semiconductor structure including a helical conductor that surrounds a through-substrate via and penetrates through two dies and a manufacturing method of the semiconductor structure.

Description of Related Art

For a need for miniaturization of a semiconductor device, a reduction in size of various electronic circuits, such as inductors, is performed. Inductors are important passive two-terminal electrical components that stores energy in a magnetic field when electric current flows through it, and generally are used in many discrete element circuits. Since traditional inductors are bulky components, successful integration of the traditional discrete element circuits requires the development of miniaturized inductors.

For example, one approach is to manufacture a spiral-type inductor using conventional integrated circuit processes. Unfortunately, spiral inductors usually occupy a large area, and the fabrication of such spiral inductor with high inductance is expensive. Accordingly, it is necessary to develop other approaches to miniaturizing an inductor in a semiconductor device.

SUMMARY

The present disclosure provides a semiconductor structure. The semiconductor structure includes a first die, a second die, a connecting portion, and a through-substrate via. The first die includes a first dielectric layer and a first helical conductor embedded therein. The second die includes a second dielectric layer and a second helical conductor embedded therein, wherein the second dielectric layer is bonded with the first dielectric layer, thereby forming an interface. The connecting portion extends from the first dielectric layer through the interface to the second dielectric layer and interconnects the first helical conductor with the second helical conductor. The through-substrate via extends from the first die to the second die through the interface, wherein the through-substrate via is surrounded by the first and the second helical conductors.

In some embodiments, the second helical conductor includes one turn which has a surface substantially coplanar with the interface between the first dielectric layer and the second dielectric layer.

In some embodiments, the first die further includes a first lead in the first dielectric layer, the second die further includes a second lead in the second dielectric layer, the first helical conductor is electrically connected to the first lead, and the second helical conductor is electrically connected to the second lead.

In some embodiments, the first die further includes a first lead and a second lead in the first dielectric layer, the first helical conductor is electrically connected to the first lead, and the second helical conductor is electrically connected to the second lead.

In some embodiments, the semiconductor structure further includes a redistribution structure, wherein the second helical conductor is electrically connected to the second lead through the redistribution structure.

In some embodiments, the semiconductor structure further includes a conductive layer embedded in the first dielectric layer and in contact with a bottom of the through-substrate via.

The present disclosure provides a method of manufacturing a semiconductor structure. (i) A first die and a second die are received. The first die includes a first dielectric layer and a first helical conductor embedded therein. The second die includes a second dielectric layer and a second helical conductor embedded therein. (ii) The first dielectric layer and the second dielectric layer are bonded so that the first helical conductor is in contact with the second helical conductor. (iii) A through-substrate via is formed through the first die and the second die, wherein the through-substrate via is surrounded by the first and the second helical conductors.

In some embodiments, in step (i), the first helical conductor has at least one turn and a vertical extending portion connecting with the at least one turn, and the vertical extending portion is exposed from a surface of the first dielectric layer.

In some embodiments, in step (ii), the surface of the first dielectric layer is bonded with the second dielectric layer.

In some embodiments, in step (i), the second helical conductor includes one turn exposed from a surface of the second dielectric layer.

In some embodiments, in step (ii), the surface of the second dielectric layer is bonded with the first dielectric layer.

In some embodiments, the first die further includes a conductive layer embedded in the first dielectric layer. Forming the through-substrate via through the first die and the second die includes: forming a hole through the first die and the second die to expose the conductive layer; forming a liner layer covering an inner surface of the hole; removing a portion of the liner layer to expose the conductive layer; and forming a metal layer on the liner layer and the conductive layer.

In some embodiments, before forming the metal layer on the liner layer and the conductive layer, the method further includes forming a barrier layer on the liner layer and the conductive layer.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows:

FIG. 2 is a flowchart of a method of manufacturing a semiconductor structure in accordance with some embodiments of the present disclosure.

DETAILED DESCRIPTION

Figure 1A:
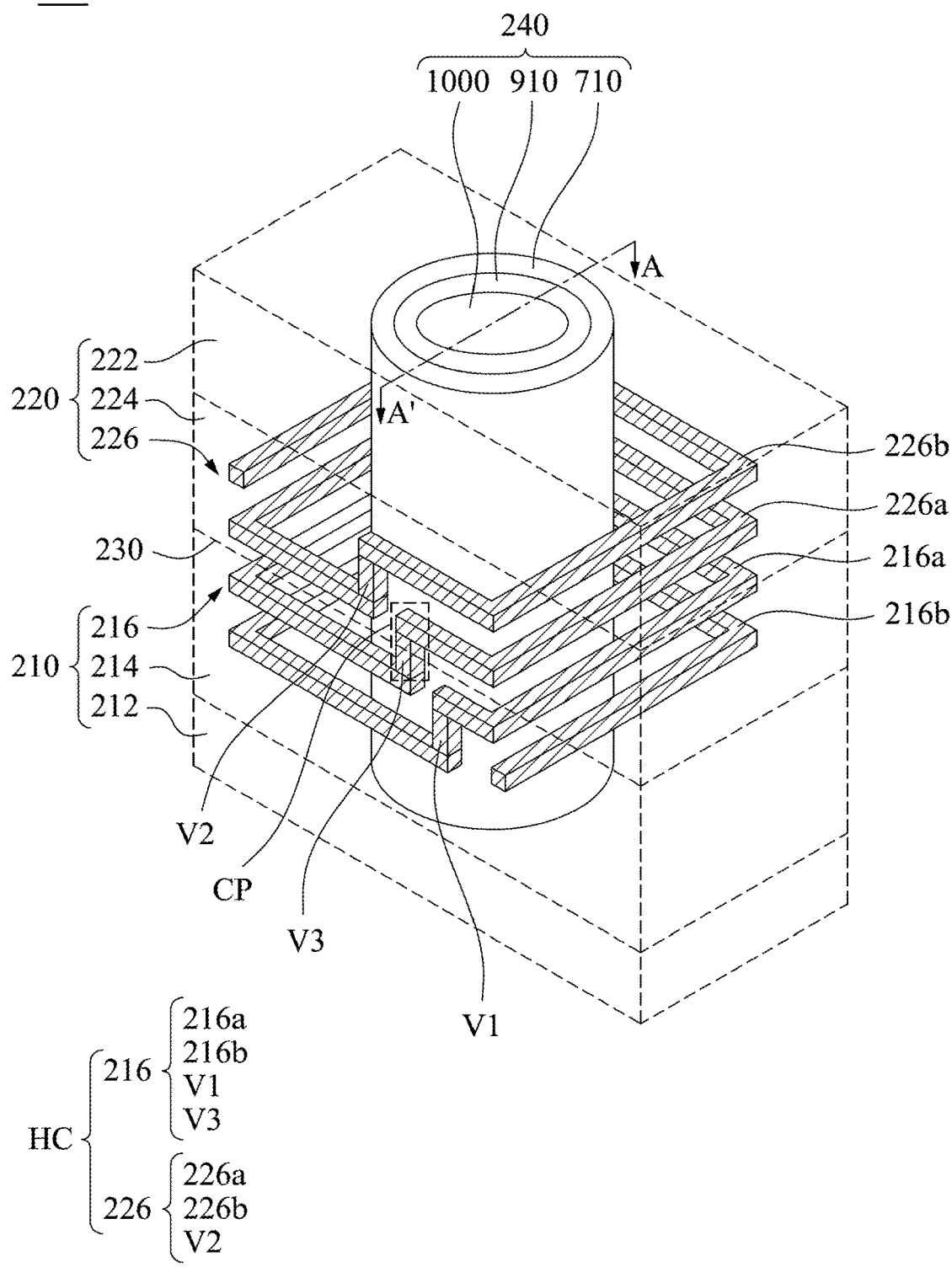
FIG. 1A is a semiconductor structure in accordance with some embodiments of the present disclosure.

Reference will now be made in detail to the present embodiments of the, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

Figure 1B:
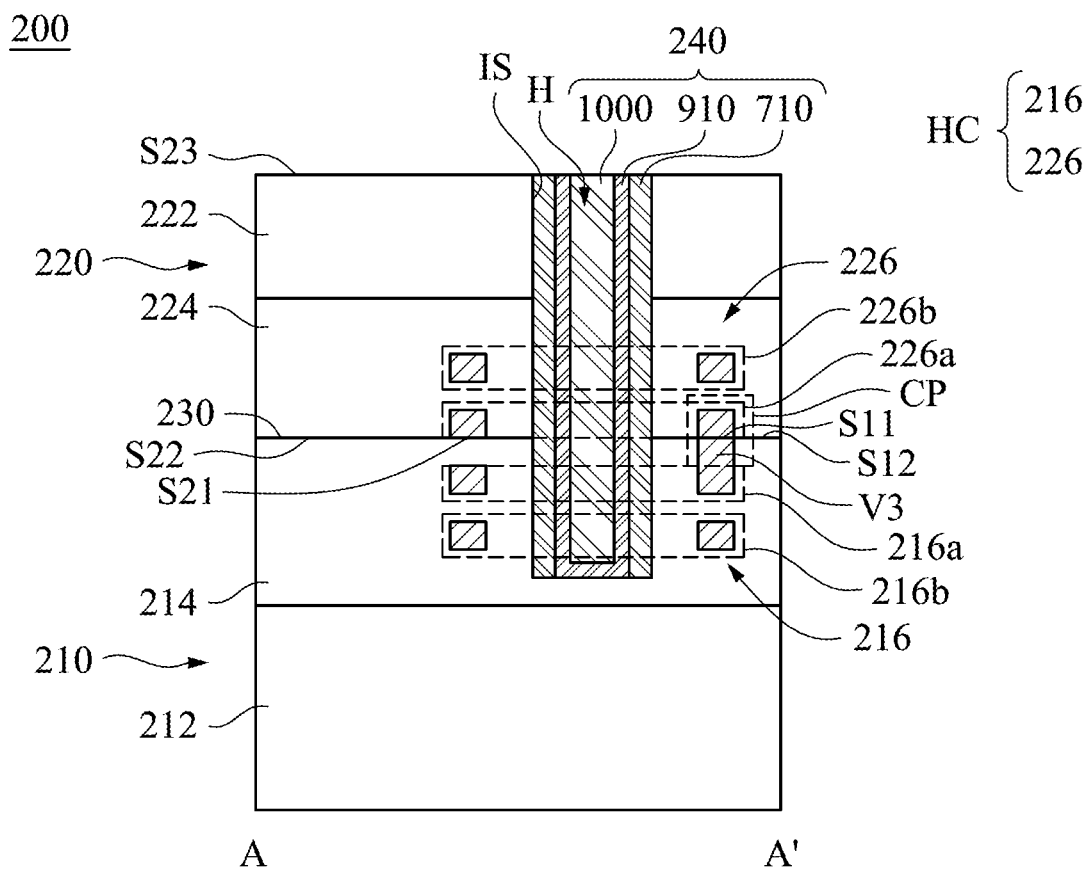
FIG. 1B is a cross-sectional view of the semiconductor structure in FIG. 1A along a cross-section line AA' in accordance with some embodiments of the present disclosure.

FIG. 1A is a semiconductor structure 200 in accordance with some embodiments of the present disclosure. FIG. 1B is a cross-sectional view of the semiconductor structure 200 in FIG. 1A along a cross-section line AA' in accordance with some embodiments of the present disclosure.

Please refer to FIGS. 1A and 1B simultaneously. The semiconductor structure 200 includes a first die 210, a second die 220, and a through-substrate via 240. The second die 220 is disposed on the first die 210. The first die 210 includes a first substrate 212, a first dielectric layer 214, and a first helical conductor 216 embedded in the first dielectric layer 214. The first dielectric layer 214 is disposed on the first substrate 212. The second die 220 includes a second substrate 222, a second dielectric layer 224, and a second helical conductor 226 embedded in the second dielectric layer 224. The second dielectric layer 224 is disposed under the second substrate 222. The second dielectric layer 224 is bonded with the first dielectric layer 214, thereby forming an interface 230 between the first dielectric layer 214 and the second dielectric layer 224. A connecting portion CP extends from the first dielectric layer 214 through the interface 230 to the second dielectric layer 224 and interconnects the first helical conductor 216 with the second helical conductor 226. The through-substrate via 240 extends from the first die 210 to the second die 220 through the interface 230, wherein the through-substrate via 240 is surrounded by the first helical conductor 216 and the second helical conductor 226. The through-substrate via 240 includes a metal layer 1000, a barrier layer 910 surrounding the metal layer 1000, and a liner layer 710 surrounding the barrier layer 910.

Still refer to FIGS. 1A and 1B. The first helical conductor 216 has at least one turn around the through-substrate via 240. Two neighboring turns are connected by a vertical extending portion. For example, as shown in FIG. 1A, the first helical conductor 216 has two complete turns 216a, 216b around the through-substrate via 240, and the turn 216a and turn 216b are connected by a vertical extending portion V1. Similarly, the second helical conductor 226 has at least one turn around the through-substrate via 240. Two neighboring turns are connected by a vertical extending portion. For example, as shown in FIG. 1A, the second helical conductor 226 has two complete turns 226a, 226b around the through-substrate via 240, and the turn 226a and turn 226b are connected by a vertical extending portion V2. The first helical conductor 216 has a vertical extending portion V3 connecting the turn 216a of the first helical conductor 216 and the turn 226a of the second helical conductor 226. The vertical extending portion V3 and a portion of the turn 226a of the second helical conductor 226 form the connecting portion CP. Further, as shown in FIG. 1B, the turn 226a of the second helical conductor 226 has a surface S21 substantially coplanar with the interface 230 between the first dielectric layer 214 and the second dielectric layer 224. The turns 216a, 216b, 226a, and 226b are substantially parallel, and respectively have a rectangular shape in top view (not shown), but not limited thereto. Although the first helical conductor 216 and the second helical conductor 226 respectively have two turns, the number of turns can vary according to design needs.

Still refer to FIGS. 1A and 1B. The first helical conductor 216 and the second helical conductor 226 form a helical conductor HC surrounding the through-substrate via 240 and penetrating through the first die 210 and the second die 220. In some embodiments, the helical conductor HC is substantially coaxially with the first helical conductor 216 and the second helical conductor 226. In some embodiments, the helical conductor HC is configured to induce a magnetic field in the through-substrate via 240 in response to a current passing through the helical conductor HC. The first helical conductor 216 and the second helical conductor 226 are inductor and can provide high inductance while only occupying a small space.

In some embodiments, the first substrate 212 and the second substrate 222 respectively include silicon, glass, gallium arsenide, gallium nitride, or a combination thereof. In some embodiments, the first dielectric layer 214 and the second dielectric layer 224 respectively include silicon oxide, silicon nitride, polyimide, or a combination thereof. In some embodiments, the first helical conductor 216 and the second helical conductor 226 respectively include copper, gold, tungsten, or alloys thereof.

Figure 1C:
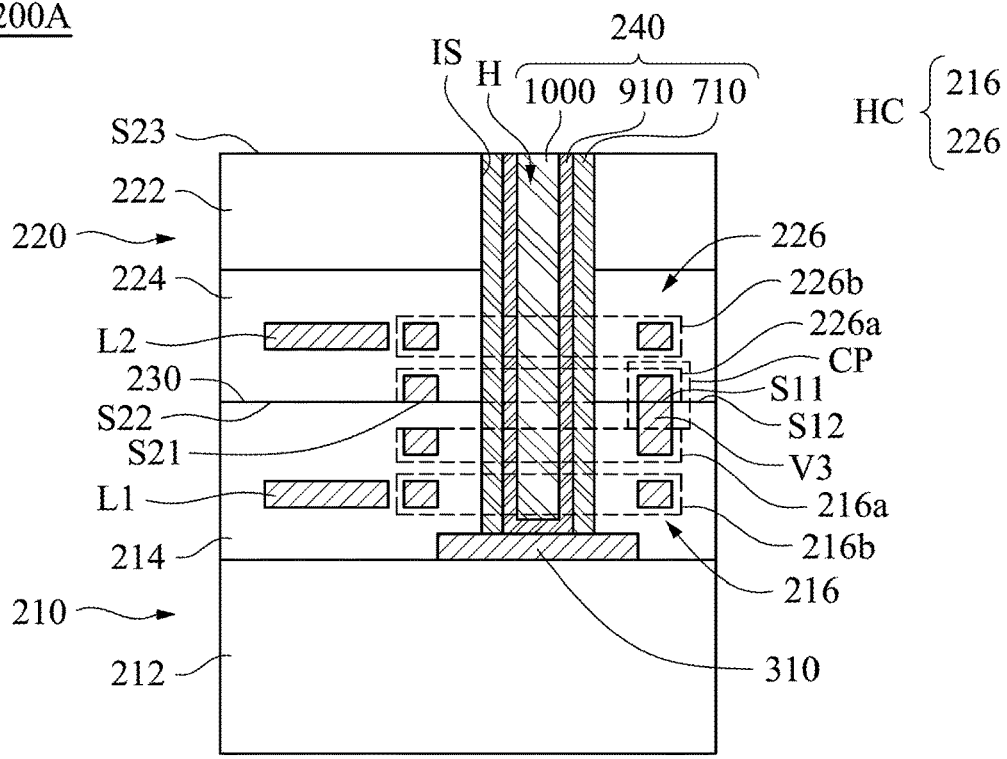
FIGS. 1C-1D are cross-sectional views of a semiconductor structure in accordance with some embodiments of the present disclosure.

FIG. 1C is a cross-sectional view of a semiconductor structure 200A in accordance with some embodiments of the present disclosure. The difference between the semiconductor structure 200A and the semiconductor structure 200 shown in FIG. 1B is that the semiconductor structure 200A further includes a first lead L1 and a conductive layer 310 in the first dielectric layer 214, and the second die 220 further includes a second lead L2 in the second dielectric layer 224. The first helical conductor 216 is electrically connected to the first lead L1. The second helical conductor 226 is electrically connected to the second lead L2. The conductive layer 310 is sandwiched between the first substrate 212 and the through-substrate via 240 and is in contact with the bottom of the through-substrate via 240. The first helical conductor 216 and the second helical conductor 226 can be operably connected to other circuit elements (not shown) by the first lead L1 and second lead L2. In some embodiments, the first helical conductor 216 and the second helical conductor 226 are inductor, and can be configured to induce a magnetic field in the through-substrate via 240 in response to a current passing through the first helical conductor 216 and the second helical conductor 226 (e.g., provided by a voltage differential applied across the first lead L1 and second lead L2).

Figure 1D:
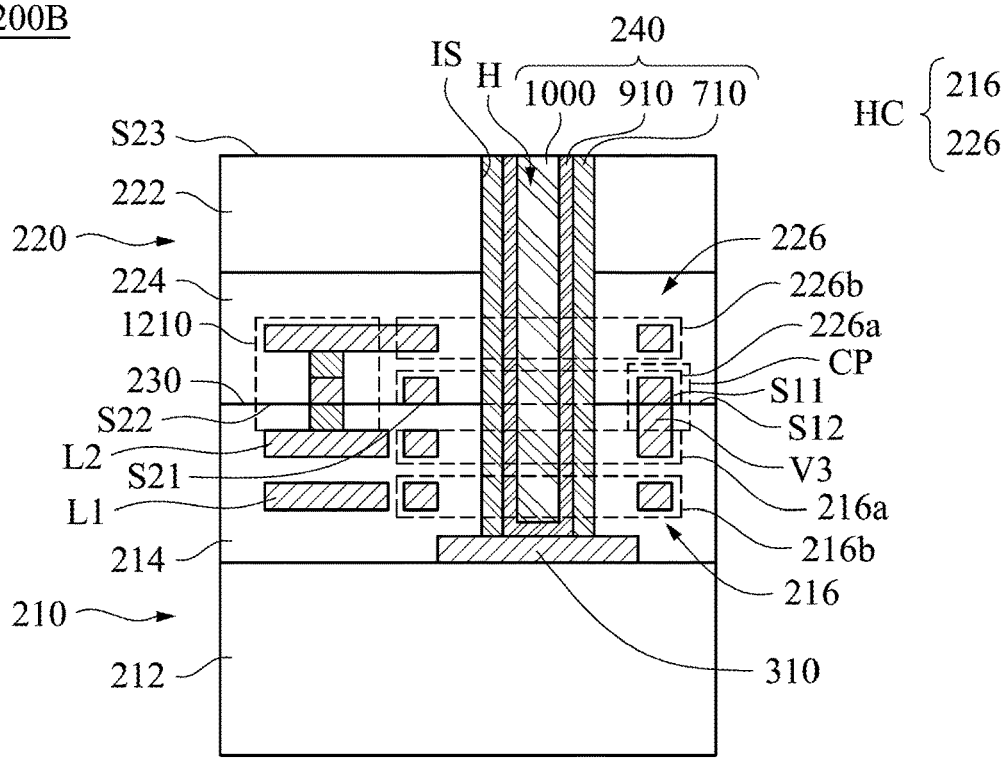

FIG. 1D is a cross-sectional view of a semiconductor structure 200B in accordance with some embodiments of the present disclosure. The difference between the semiconductor structure 200B and the semiconductor structure 200A is that the first die 210 of the semiconductor structure 200B includes a second lead L2 in the first dielectric layer 214 rather than in the second dielectric layer 224 and further includes a redistribution structure 1210. The second helical conductor 226 is electrically connected to the second lead L2 through the redistribution structure 1210. The redistribution structure 1210 extends from the first dielectric layer 214 through the interface 230 to the second dielectric layer 224 and interconnects the second helical conductor 226 with the second lead L2. The first helical conductor 216 and the second helical conductor 226 can be operably connected to other circuit elements (not shown) by the first lead L1 and second lead L2. In some embodiments, the first helical conductor 216 and the second helical conductor 226 are inductor, and can be configured to induce a magnetic field in the through-substrate via 240 in response to a current passing through the first helical conductor 216 and the second helical conductor 226 (e.g., provided by a voltage differential applied across the first lead L1 and second lead L2).

FIG. 2 is a flowchart of a method 100 of manufacturing a semiconductor structure in accordance with some embodiments of the present disclosure. In operation 110, a first die and a second die are received, wherein the first die includes a first dielectric layer and a first helical conductor embedded therein, and the second die includes a second dielectric layer and a second helical conductor embedded therein. In operation 120, the first dielectric layer and the second dielectric layer is bonded so that the first helical conductor is in contact with the second helical conductor. In operation 130, a through-substrate via is formed through the first die and the second die, wherein the through-substrate via is surrounded by the first and the second helical conductors. It is understood that FIG. 2 has been simplified for a good understanding of the concepts of the instant disclosure. Accordingly, it should be noted that additional processes may be provided before, during, and after the methods of FIG. 2, and that some other processes may only be briefly described herein.

FIGS. 3-11 are cross-sectional views of a semiconductor structure at various manufacturing stages in accordance with some embodiments of the present disclosure.

Figure 3:
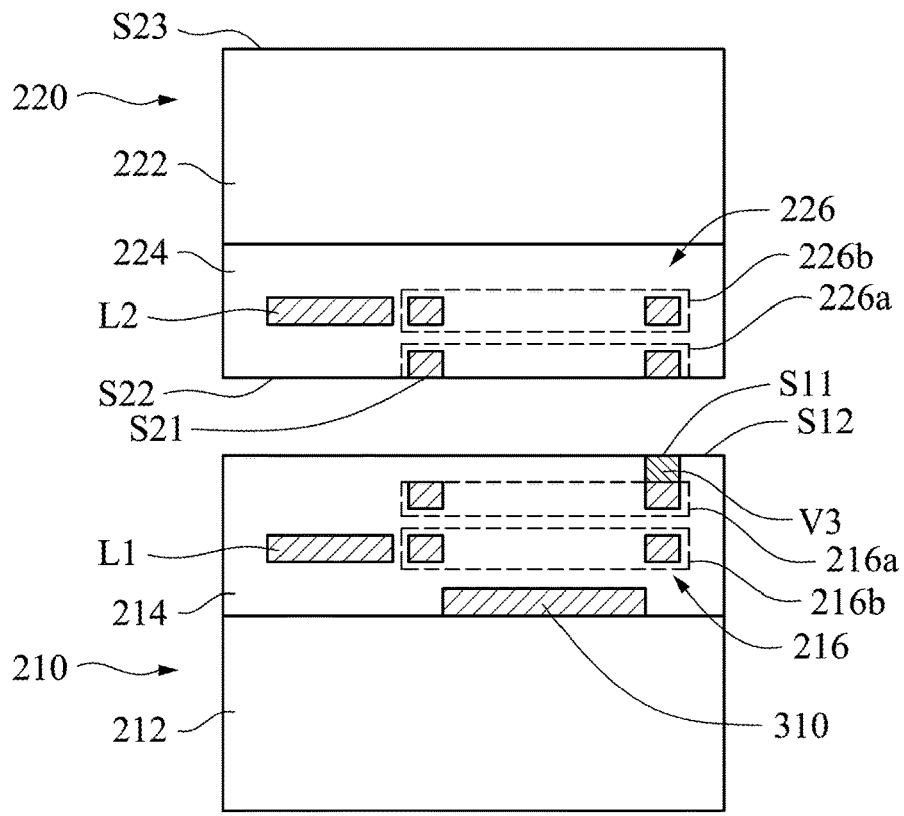
FIGS. 3-11 are cross-sectional views of a semiconductor structure at various manufacturing stages in accordance with some embodiments of the present disclosure.

As show in FIG. 3, a first die 210 and a second die 220 are received. The first die 210 includes a first substrate 212, a first dielectric layer 214, a first helical conductor 216, a conductive layer 310 and a first lead L1. The first dielectric layer 214 is disposed on the first substrate 212. The first helical conductor 216 is embedded in the first dielectric layer 214 and electrically connected to the first lead L1. The conductive layer 310 is embedded in the first dielectric layer 214 and in contact with the first substrate 212. The second die 220 includes a second substrate 222, a second dielectric layer 224, a second helical conductor 226, and a second lead L2. The second dielectric layer 224 is disposed under the second substrate 222. The second helical conductor 226 is embedded in the second dielectric layer 224 and electrically connected to the second lead L2.

As shown in FIG. 3, the first helical conductor 216 has turns 216a, 216b, and a vertical extending portion V3 connecting with the turn 216a. The vertical extending portion V3 is exposed from a surface S12 of the first dielectric layer 214. In some embodiments, the first helical conductor 216 has a surface S11 substantially coplanar with the surface S12 of the first dielectric layer 214. The second helical conductor 226 has turns 226a, 226b. The turn 226a is exposed from a surface S22 of the second dielectric layer 224. In some embodiments, the second helical conductor 226 has a surface S21 substantially coplanar with the surface S22 of the second dielectric layer 224.

Figure 4:
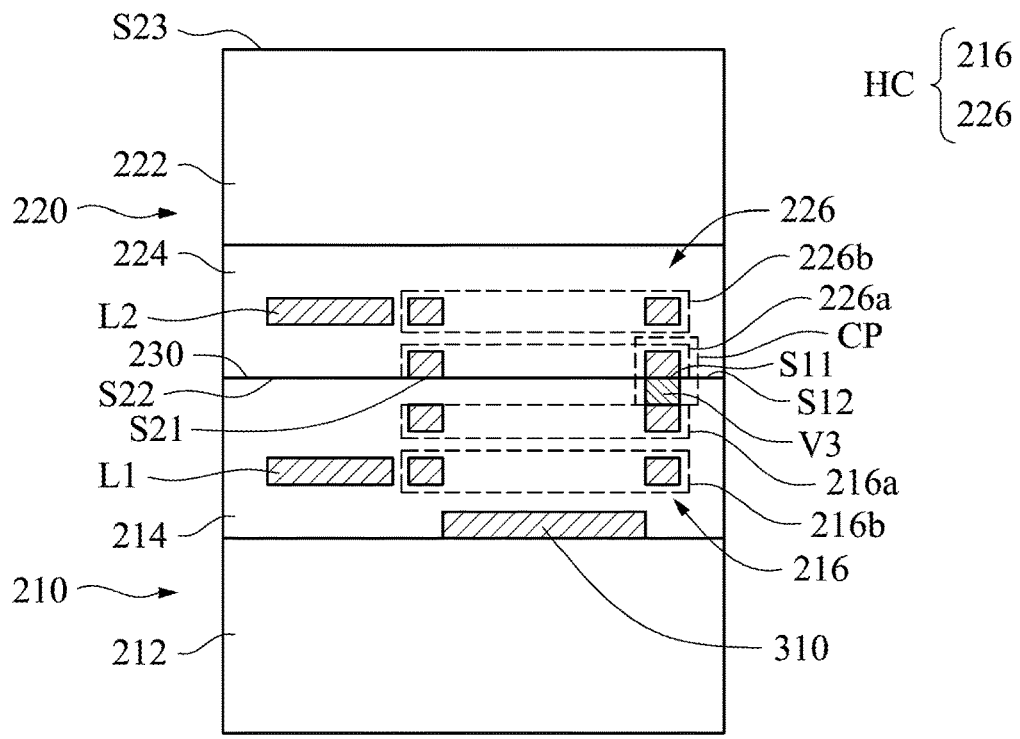

Reference is made to FIG. 4, the first dielectric layer 214 and the second dielectric layer 224 are bonded so that the first helical conductor 216 is in contact with the second helical conductor 226 to form a helical conductor HC, and an interface 230 is formed between the first dielectric layer 214 and the second dielectric layer 224. More specifically, the surface S22 of the second dielectric layer 224 is bonded with the first dielectric layer 214, and the surface S12 of the first dielectric layer 214 is bonded with the second dielectric layer 224. In some embodiments, the first die 210 and the second die 220 are bonded together by hybrid bonding. The turn 226a of the second helical conductor 226 has the surface S21 substantially coplanar with the interface 230. The first helical conductor 216 has the vertical extending portion V3 connecting the turn 216a of the first helical conductor 216 and the turn 226a of the second helical conductor 226. The vertical extending portion V3 and a portion of the turn 226a of the second helical conductor 226 form a connecting portion CP. The connecting portion CP extends from the first dielectric layer 214 through the interface 230 to the second dielectric layer 224 and interconnects the first helical conductor 216 with the second helical conductor 226.

Figure 5:
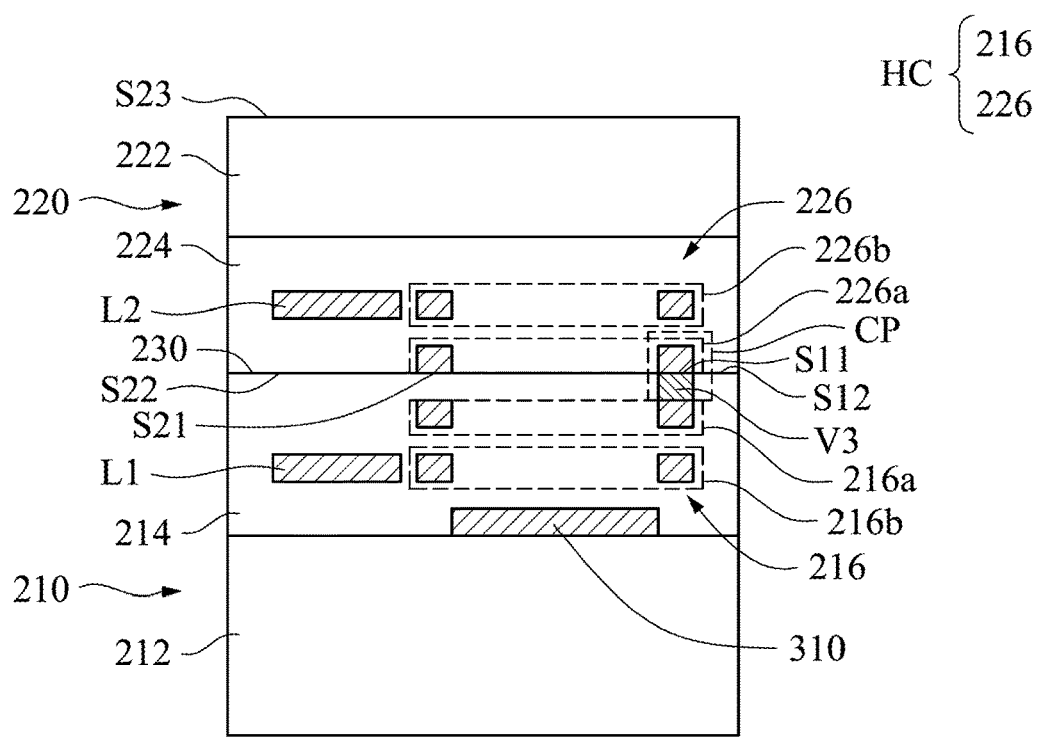

As shown in FIG. 5, the second substrate 222 is thinned from a surface S23 opposite the second dielectric layer 224.

Figure 6:
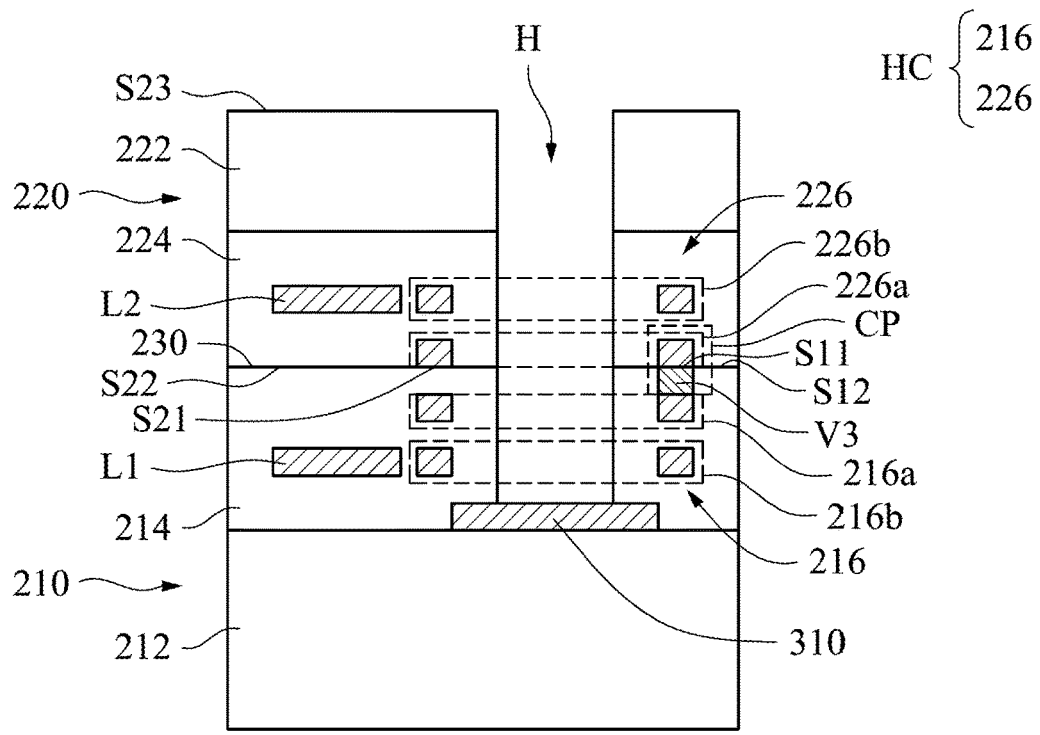

As shown in FIG. 6, a hole H is formed through the first die 210 and the second die 220 to expose the conductive layer 310 embedded in the first dielectric layer 214. More specifically, a portion of the second substrate 222, a portion of the second dielectric layer 224, and a portion of the first dielectric layer 214 are removed to expose the conductive layer 310. The hole H is surrounded by the first helical conductor 216 and the second helical conductor 226. In some embodiments, the hole H is substantially coaxially with the first helical conductor 216 and the second helical conductor 226.

Figure 7:
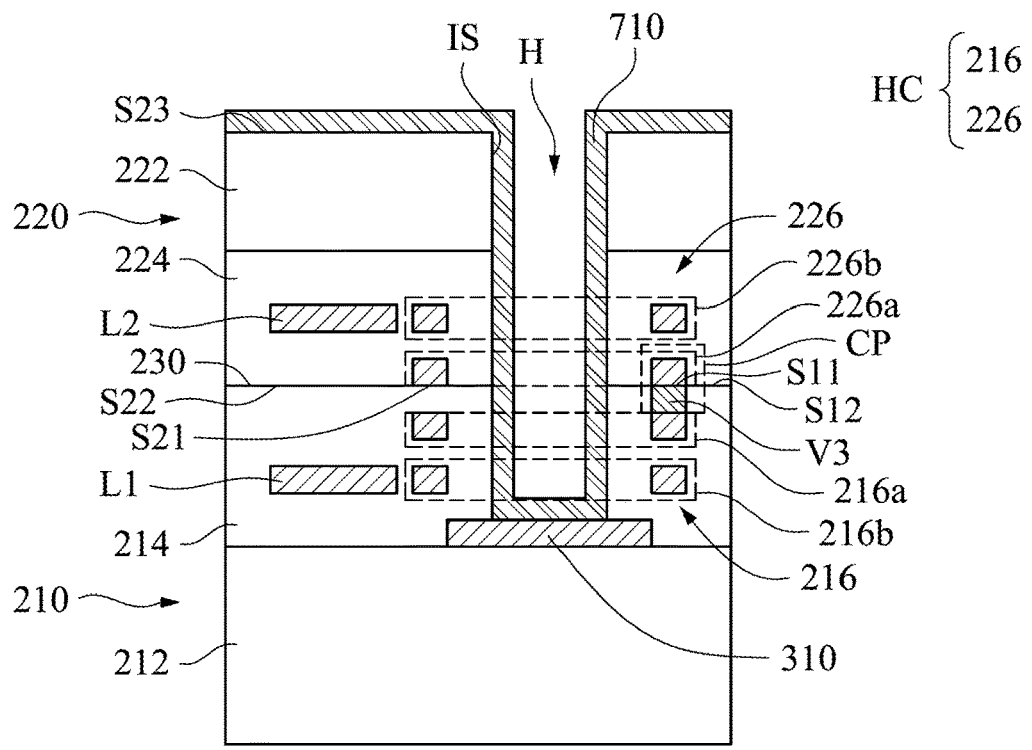

As shown in FIG. 7, a liner layer 710 is formed to cover an inner surface IS of the hole H. More specifically, the liner layer 710 is formed to cover the second substrate 222, the second dielectric layer 224, the first dielectric layer 214, and the conductive layer 310. In some embodiments, the liner layer 710 is formed by chemical vapor deposition (CVD), atomic layer deposition (ALD), physical vapor deposition (PVD) or plasma-enhanced chemical vapor deposition (PECVD). In some embodiments, the liner layer 710 includes silicon oxide, silicon nitride, or a combination thereof.

Figure 8:
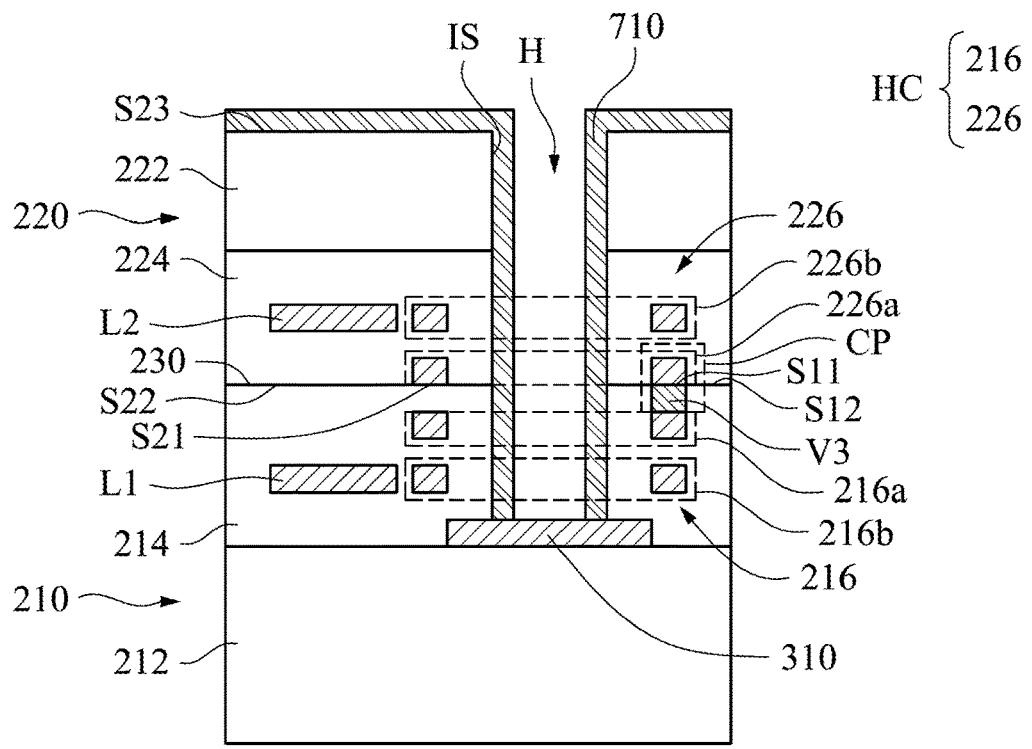

As shown in FIG. 8, a portion of the liner layer 710 is removed to expose the conductive layer 310. In some embodiments, the portion of the liner layer 710 is removed by etching.

Figure 9:
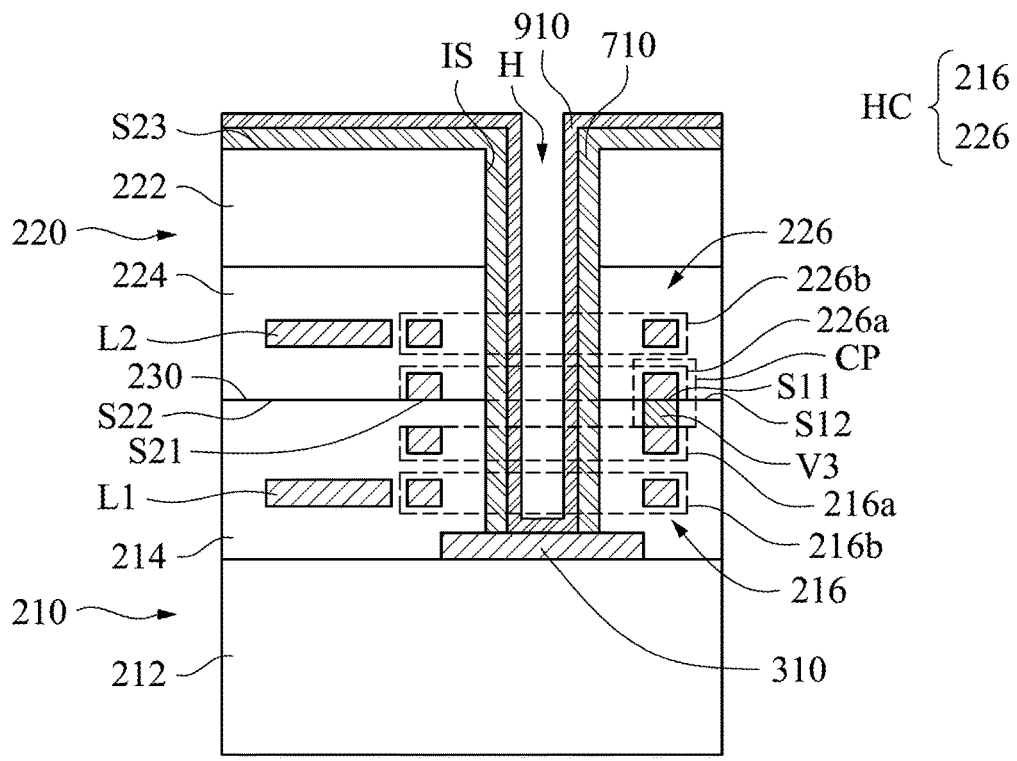

As shown in FIG. 9, a barrier layer 910 is formed on the liner layer 710 and the conductive layer 310. In some embodiments, the barrier layer 910 is formed by plating, CVD, ALD, PVD or PECVD. In some embodiments, the barrier layer 910 includes copper, tantalum, or an alloy thereof. In some other embodiments, the barrier layer 910 is omitted.

Figure 10:
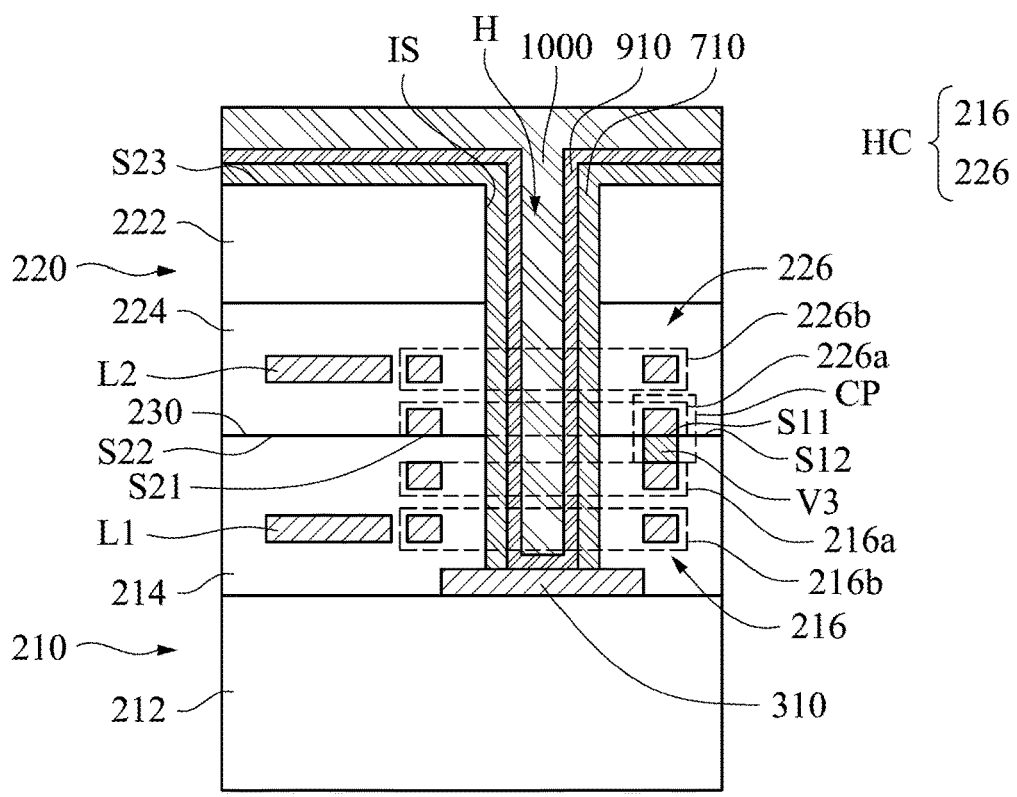

As shown in FIG. 10, a metal layer 1000 is formed on the barrier layer 910 and fills the hole H. In some embodiments, the metal layer 1000 is formed by plating, CVD, ALD, PVD or PECVD. In some embodiments, the metal layer 1000 includes copper, tungsten, aluminum, or alloy thereof.

Figure 11:
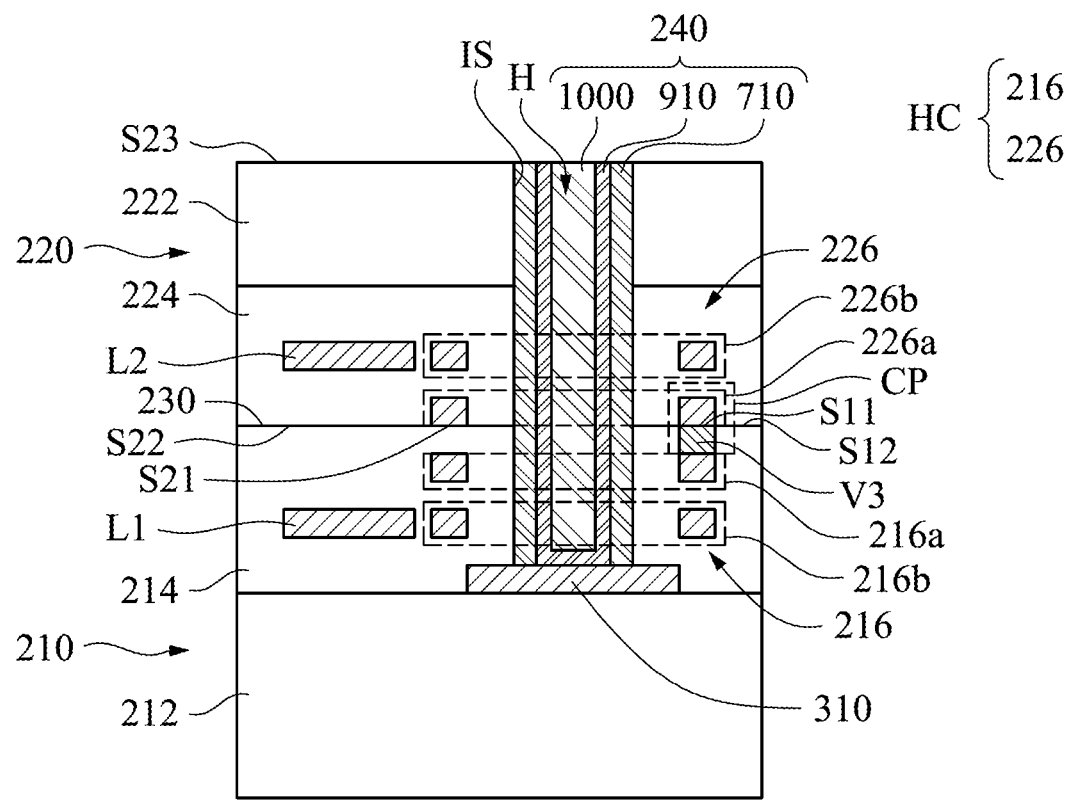

As shown in FIG. 11, a portion of the liner layer 710, a portion of the barrier layer 910, and a portion of the metal layer 1000 are removed to form a through-substrate via 240 by, for example, a chemical mechanical planarization (CMP).

Still refer to FIG. 11. The through-substrate via 240 includes the metal layer 1000, the barrier layer 910 surrounding the metal layer 1000, and the liner layer 710 surrounding the barrier layer 910. The through-substrate via 240 extends from the first die 210 to the second die 220 through the interface 230. The through-substrate via 240 is surrounded by the first helical conductor 216 and the second helical conductor 226. The vertical extending portion V3 and a portion of the turn 226a of the second helical conductor 226 form the connecting portion CP. The connecting portion CP extends from the first dielectric layer 214 through the interface 230 to the second dielectric layer 224 and interconnects the first helical conductor 216 with the second helical conductor 226. Accordingly, the helical conductor HC formed by connecting the first helical conductor 216 and the second helical conductor 226 surrounds the through-substrate via 240 and penetrates through the first die 210 and the second die 220.

Based on the above, the first helical conductor and the second helical conductor of the present disclosure can be used as inductor, and can provide high inductance while only occupying a small space. Moreover, the inductance can be easily adjusted by the number of turns of the first helical conductor and the second helical conductor.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor structure, comprising:
a first die comprising a first dielectric layer and a first helical conductor embedded therein, wherein the first helical conductor comprises a first turn and a vertical extending portion, and the vertical extending portion extends from an upper surface of the first turn;
a second die disposed on the first die and comprising a second dielectric layer and a second helical conductor embedded therein, wherein the second dielectric layer is bonded with the first dielectric layer, thereby forming an interface, the second helical conductor comprises a second turn which has a lower surface substantially coplanar with the interface, and the second turn of the second helical conductor is in contact with the vertical extending portion of the first helical conductor; and
a through-substrate via extending from the first die to the second die through the interface, wherein the through-substrate via is surrounded by the first and the second helical conductors.

2. The semiconductor structure of claim 1, wherein the first die further comprises a first lead in the first dielectric layer, the second die further comprises a second lead in the second dielectric layer, the first helical conductor is electrically connected to the first lead, and the second helical conductor is electrically connected to the second lead.

3. The semiconductor structure of claim 1, wherein the first die further comprises a first lead and a second lead in the first dielectric layer, the first helical conductor is electrically connected to the first lead, and the second helical conductor is electrically connected to the second lead.

4. The semiconductor structure of claim 3, further comprising a redistribution structure, wherein the second helical conductor is electrically connected to the second lead through the redistribution structure.

5. The semiconductor structure of claim 1, further comprising a conductive layer embedded in the first dielectric layer and in contact with a bottom of the through-substrate via.

6. A method of manufacturing a semiconductor structure, the method comprising:
(i) receiving a first die and a second die, wherein
the first die comprises a first dielectric layer and a first helical conductor embedded therein, the first helical conductor comprises a first turn and a vertical extending portion, and the vertical extending portion extends from an upper surface of the first turn and is exposed from a first surface of the first dielectric layer,
the second die comprises a second dielectric layer and a second helical conductor embedded therein, and the second helical conductor comprises a second turn exposed from a second surface of the second dielectric layer;
(ii) bonding the first surface of the first dielectric layer and the second surface of the second dielectric layer so that the vertical extending portion of the first helical conductor is in contact with the second turn of the second helical conductor; and
(iii) forming a through-substrate via through the first die and the second die, wherein the through-substrate via is surrounded by the first and the second helical conductors.

7. The method of claim 6, wherein in step (ii), the first surface of the first dielectric layer is bonded with the second surface of the second dielectric layer.

8. The method of claim 6, wherein the first die further comprises a conductive layer embedded in the first dielectric layer, and forming the through-substrate via through the first die and the second die comprises:
forming a hole through the first die and the second die to expose the conductive layer;
forming a liner layer covering an inner surface of the hole;
removing a portion of the liner layer to expose the conductive layer; and
forming a metal layer on the liner layer and the conductive layer.

9. The method of claim 8, before forming the metal layer on the liner layer and the conductive layer, further comprising:
forming a barrier layer on the liner layer and the conductive layer.

* * * * *